(12) United States Patent
Hofmans et al.

(10) Patent No.: US 8,436,998 B2
(45) Date of Patent: *May 7, 2013

(54) METHOD OF MEASURING FOCUS OF A LITHOGRAPHIC PROJECTION APPARATUS

(75) Inventors: Gerardus Carolus Johannus Hofmans, Eindhoven (NL); Hubertus Antonius Geraets, Arendonk (BE); Mark Zellenrath, Veldhoven (NL); Sven Gunnar Krister Magnusson, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/603,139

(22) Filed: Sep. 4, 2012

(65) Prior Publication Data
US 2013/0003031 A1      Jan. 3, 2013

Related U.S. Application Data

(63) Continuation of application No. 12/273,772, filed on Nov. 19, 2008, now Pat. No. 8,289,516.

(60) Provisional application No. 60/996,506, filed on Nov. 20, 2007.

(51) Int. Cl.
*G01B 11/00* (2006.01)

(52) U.S. Cl.
USPC ............. 356/401; 356/399; 356/124; 355/55; 355/77

(58) Field of Classification Search .......... 356/399–401; 355/55, 77; 430/22, 30
See application file for complete search history.

(56) References Cited

U.S. PATENT DOCUMENTS

| | | | |
|---|---|---|---|
| 4,645,338 A | | 2/1987 | Juliana, Jr. et al. |
| 5,789,118 A | * | 8/1998 | Liu et al. ............................ 430/5 |
| 6,563,564 B2 | | 5/2003 | De Mol et al. |
| 6,646,729 B2 | | 11/2003 | Van Der Laan et al. |
| 6,777,139 B2 | * | 8/2004 | Baselmans ........................ 430/5 |
| 6,936,385 B2 | * | 8/2005 | Lof et al. ......................... 430/22 |
| 7,564,556 B2 | * | 7/2009 | Chang et al. .................. 356/401 |

(Continued)

FOREIGN PATENT DOCUMENTS

| | | |
|---|---|---|
| EP | 1 457 828 | 9/2004 |
| EP | 1 566 696 | 2/2005 |

(Continued)

OTHER PUBLICATIONS

Search Report in related Singapore Application 200808820-5 mailed Jul. 15, 2010.

(Continued)

*Primary Examiner* — Tarifur Chowdhury
*Assistant Examiner* — Isiaka Akanbi
(74) *Attorney, Agent, or Firm* — Pillsbury Winthrop Shaw Pittman LLP

(57) ABSTRACT

A method of measuring focus of a lithographic projection apparatus includes exposure of a photoresist covered test substrate with a plurality of verification fields. Each of the verification fields includes a plurality of verification markers, and the verification fields are exposed using a predetermined focus offset. After developing, an alignment offset for each of the verification markers is measured and translated into defocus data using a transposed focal curve.

9 Claims, 3 Drawing Sheets

U.S. PATENT DOCUMENTS

| | | | |
|---|---|---|---|
| 8,289,516 B2 * | 10/2012 | Hofmans et al. | 356/401 |
| 2002/0008869 A1 | 1/2002 | Van Der Laan et al. | |
| 2002/0036758 A1 | 3/2002 | De Mol et al. | |
| 2005/0094132 A1 | 5/2005 | Starikov et al. | |
| 2006/0023214 A1 * | 2/2006 | Lof et al. | 356/401 |

FOREIGN PATENT DOCUMENTS

| | | |
|---|---|---|
| JP | 2004055575 | 3/1992 |
| JP | 10055946 | 2/1998 |
| JP | 04078126 | 2/2004 |
| JP | 2004040102 | 2/2004 |
| TW | 500987 | 9/2002 |
| TW | 200415451 | 8/2004 |
| TW | I256484 | 7/2006 |
| WO | 2006/001785 | 1/2006 |

OTHER PUBLICATIONS

Office Action in related Japanese application No. 2008-290439 mailed Apr. 20, 2011.

Taiwan Office Action dated Aug. 7, 2012 in corresponding Taiwan Patent Application No. 1012078629001.

* cited by examiner

METHOD OF MEASURING FOCUS OF A LITHOGRAPHIC PROJECTION APPARATUS

This application is a continuation of U.S. patent application Ser. No. 12/273,772 filed Nov. 19, 2008 now U.S. Pat. No. 8,289,516, which in turn claims priority and benefit under 35 U.S.C. §119(e) to U.S. Provisional Patent Application Ser. No. 60/996,506, filed on Nov. 20, 2007. The contents of those applications are incorporated herein in their entirety by reference.

FIELD

The present invention relates to a method of measuring focus of a lithographic projection apparatus. It also relates to a method of calibrating such a apparatus using the method of measuring focus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the manufacture of devices using lithographic processes, each mask pattern is typically projected onto the target portion in focus. In practice, this means that the target portion of the substrate is positioned in a plane of best focus of the aerial image projected by the projection system. As the critical dimension (CD), i.e. the dimension of a feature or features in which variations will cause undesirable variation in physical properties of the feature, such as the gate width of a transistor, in lithography shrinks, consistency of focus, both across a substrate and between substrates, becomes increasingly important.

The use of an alignment system to monitor focus has been proposed and involves printing focus-sensitive alignment markers at known positions relative to normal alignment markers at various different focus settings, i.e. positions of the substrate relative to the projection system. The position of these focus-sensitive markers with respect to the normal alignment markers is measured and an alignment offset (AO) can be determined which is representative of focus errors.

The quality of focus control in lithographic tools is today verified by using the Leveling Verification Test (LVT). A potential benefit of this method is that the read-out of the wafer can be done by the alignment system present on the lithographic tool itself. Hence no off-line read-out tool may be needed. The LVT test uses a special reticle with glued glass wedges on top, to locally create non-telecentric illumination on a double telecentric lens. This non-telecentric illumination is used to cause a lateral shift in x, y as function of defocus z of the aerial image of an XPA alignment mark situated beneath a glass wedge. By measuring the alignment shift of this defocus mark with respect to XPA reference mark (imaged without wedge on top), the defocus at the moment of exposing can be determined.

Up to this point, the current LVT test has been working quite well. However, for future lithographic projection tool designs, three potential drawbacks of the LVT method may become relevant. The tighter focus control for new systems put higher demands on the signal to noise ratio of the defocus measurement technique. The read-out noise of the alignment system, and the positioning accuracy of the reference marks are important contributors to the measurement noise of LVT, due to a fairly low focus-versus alignment shift sensitivity (typically $d(X,Y)/dZ=0.4$). This low focus versus shift sensitivity can not be further increased due to restriction of the height and angle of wedges). Secondly, the LVT test has a restricted spatial sampling density due to the fact that each defocus measuring mark requires a relatively large wedge on top. Finally, and more importantly, the current LVT test method requires light being transmitted through wedges. The current LVT test method can thus not be applied for future maskless or EUV systems.

SUMMARY

It is desirable to provide a new method for doing leveling verification tests which has higher focus-versus alignment shift sensitivity and higher spatial sampling density.

According to an aspect of the invention, there is provided a method of measuring focus of a lithographic projection apparatus, the method comprising:

covering a test substrate with photo resist;

placing the test substrate on a substrate table of the lithographic apparatus;

exposing a plurality of verification fields on the test substrate, each of the verification fields comprising a plurality of verification markers, wherein the verification fields are exposed using a predetermined focus offset FO;

developing the photo resist;

measuring an alignment offset for each of the verification markers;

translating the measured alignment offsets for each of the verification markers into defocus data using a transposed focal curve.

According to a further aspect, there is provided a method of calibrating a lithographic projection apparatus, comprising the method of measuring focus described above, wherein the defocus data is used to adjust settings of the lithographic projection apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
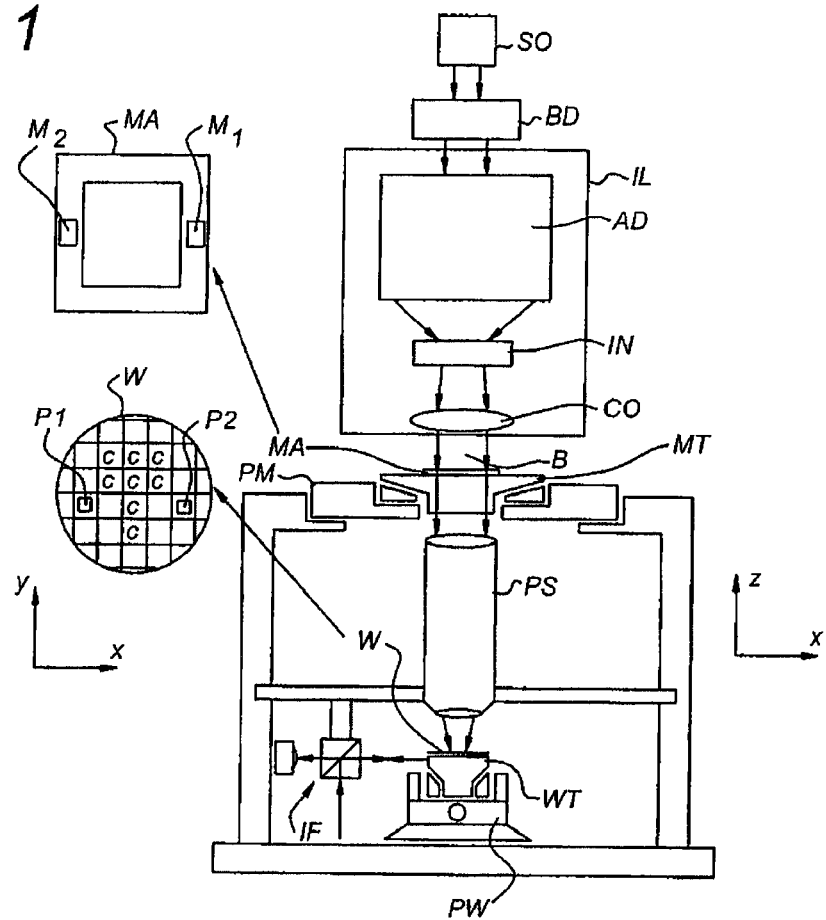
FIG. 1 depicts a lithographic apparatus which may be used in conjunction with the invention.

FIG. 1 schematically depicts an example of a lithographic projection apparatus which may be used in conjunction with the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an embodiment, a method of measuring focus of a lithographic projection apparatus is provided which can be explained as a way to perform a focus/leveling test using the well-known FOCAL reticle. First a wafer is exposed with full wafer coverage (verification) fields at a predetermined optimal focus offset FO. The purpose of the focus offset FO is to be in the most focus sensitive part of a so-called focal curve, as will be explained in more detail below.

Figure 2:
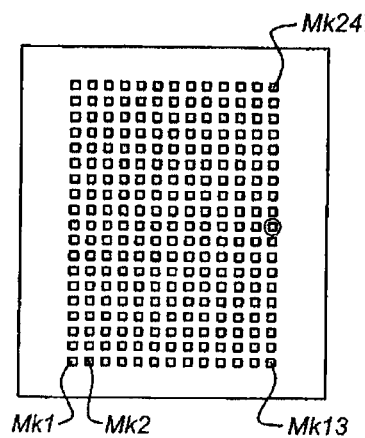
FIG. 2 shows an example of a FOCAL reticle used to expose a plurality of verification fields on a test substrate.
Figure 3:
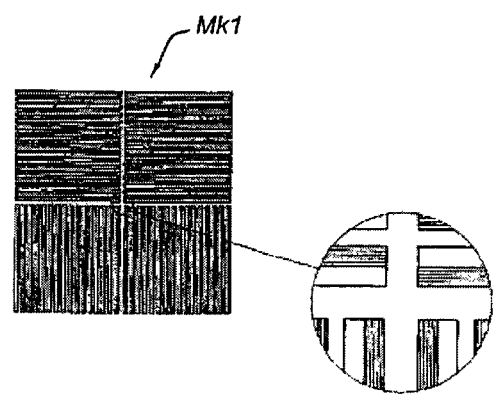
FIG. 3 shows a possible structure of such a FOCAL marker Mk1 which comprises horizontal and vertical chopped bars.

FIG. 2 shows an example of such a FOCAL reticle used to expose a plurality of verification fields on a test substrate. The FOCAL reticle comprises a plurality of markers Mk1 . . . Mk247, which are named FOCAL markers. FIG. 3 shows a possible structure of such a FOCAL marker Mk1 which comprises horizontal and vertical chopped bars. The bars in the structures may have a range of line widths and pitch sizes. Due to the particular dimensions of the structure, the line width of the chops will be focus sensitive according to the well known Bossung principle. As result of this, a FOCAL marker not exposed in focus will have an alignment offset. This offset can be used to determine a focus error also referred to as defocus.

Figure 4:
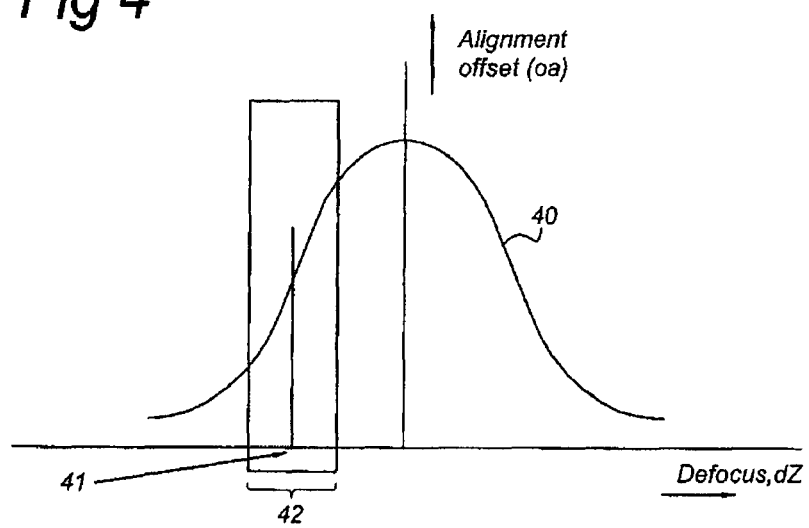
FIG. 4 shows an example of a focal curve.

The verification fields are exposed using a predetermined focus offset FO. The particular focus offset FO is determined by looking at a focal curve C(dZ) already exposed on the lithographic apparatus. An example of such a focal curve is shown in FIG. 4, see curve 40. The focal curve, reference number 40, is a graph indicating an alignment offset (ao) of measured FOCAL marks as a function of defocus dZ. In FIG. 4 a useful focus offset is shown with reference number 41. Around the focus offset a focus range 42 is indicated in which there is a unique relationship between the alignment offset and defocus dZ. The focus offset FO is determined such that all the exposed FOCAL marks will stay within the usable focus range 42 throughout the exposure, see FIG. 4. This means for example that the predetermined focus offset FO cannot be too close to dZ=0 axis since the alignment offset as function of dZ is zero which is not usable for the method. In an embodiment, the focus offset FO is selected so as to be in the middle of a working range 42 where the focal curve C(dZ) is substantially linear since this is the region of maximum focus-versus alignment sensitivity.

A typical value for the optimal focus offset FO for a projection apparatus having a NA=1.2 is about −120 nm which would have a usable range of about −200 nm.

After the exposure of the verification fields, the test substrate is developed and then an alignment offset for each of the verification markers is measured using for example a standard alignment sensor present in the system. Next, the measured alignment offsets for each of the verification markers are translated into defocus data using what is called a transposed focal curve. In an embodiment this transposed focal curve is determined by transposing a section of the focal curve of the lithographic apparatus corresponding to the working range 42, see FIG. 4. The transposed focal curve is in fact the focus sensitivity of the apparatus.

Figure 5:
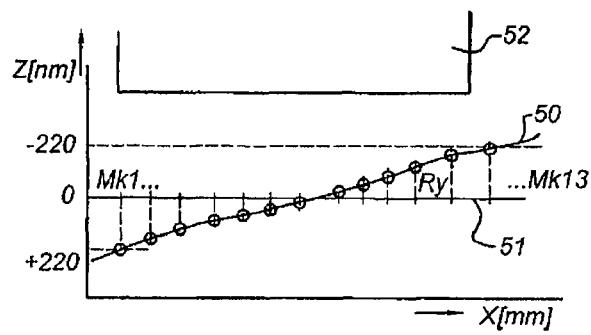
FIG. 5 shows an example on how a Ry tilt introduces Z height positions of calibration marks of one particular row of a calibration field as a function of the X-position within the field.
Figure 6:
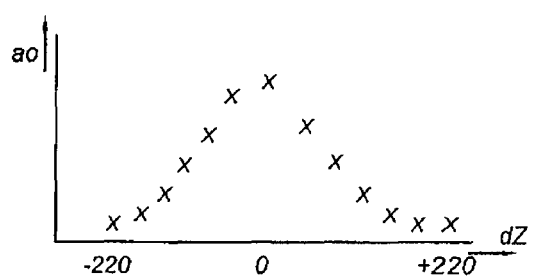
FIG. 6 shows a graph of a measured alignment offset for one single row of calibration marks of one calibration field.
Figure 7:
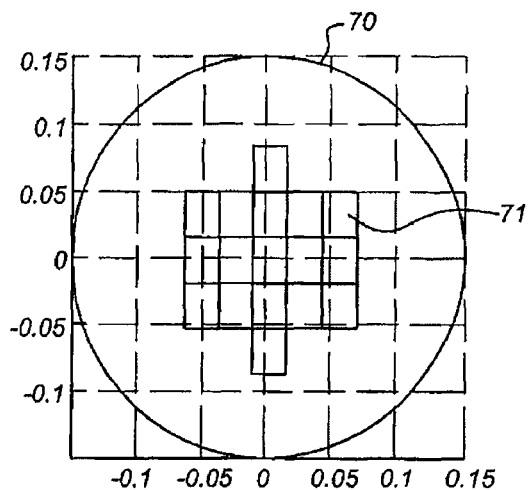
FIG. 7 shows possible positions of the calibration fields on a test substrate.

In an embodiment, after the verification fields have been exposed, additional calibration fields are exposed. In an embodiment, the calibration fields are exposed with a small shift with respect to the verification fields. The shift prevents the marks from overlapping. In an embodiment, the calibration fields are fields exposed with predefined Rx, Ry tilt offsets per field. The tilts will make rows/columns of calibration marks within the calibration fields to be exposed at different focus height. In FIG. 5, an example of the Z position of the calibration marks Mk1 . . . Mk13 of one particular row are shown as a function of the X-position. In FIG. 5 a Ry tilt (that is a rotation of the field around the Y axis) of a substrate surface 50 with respect to an image plane 51 is introduced by a tilt of the substrate W. In FIG. 5 part of a lens 52 is shown which defines the position of the image plane 51. The Ry tilt of the substrate W around the Y axis will introduce a Z defocus for FOCAL markers in each of the rows of the calibration field, (i.e. Mk1 . . . Mk13, Mk14 . . . Mk26, . . . , Mk234 ... Mk247) at different X positions. FIG. 6 shows a graph of a measured alignment offset for one single row in field X positions of calibration marks of one calibration field. The calibration fields 71 may be exposed at center positions of a substrate 70, see FIG. 7. Exposing with shifts (to avoid overlapping of exposed marks) at centre of position of same substrate is desirable get most reliable data.

Figure 8:
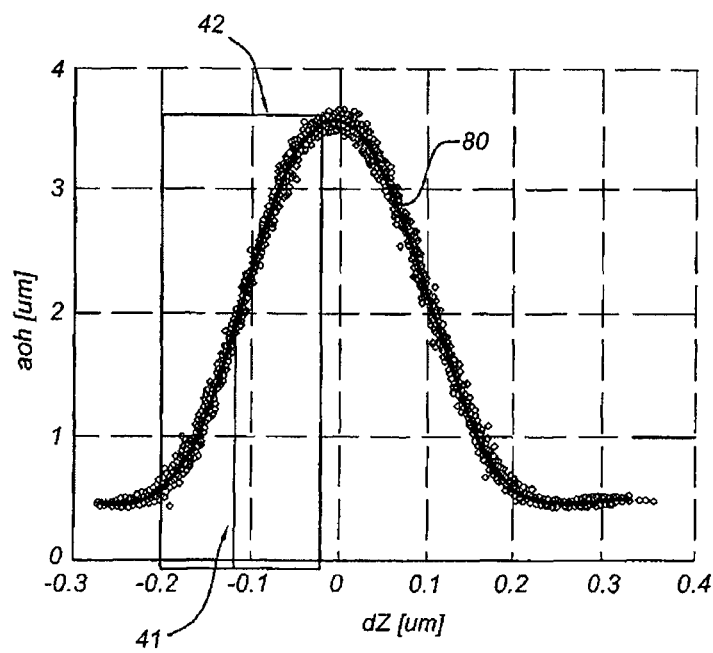
FIG. 8 shows an example of a calibration curve.

By exposing a plurality of calibration fields with tilts in Rx, Ry and small offsets, accurate focus calibration curves can be derived with a smooth distribution of focus data points. An example of such a calibration curve 80 is shown in FIG. 8. The calibration curve 80 can be used to convert the full wafer verification fields information into a defocus map. To do this part of the calibration curve is selected and transposed. This will result in a sensitivity curve $dZ=S(dX,dY)$ which can be used for calculating the dZ for each mark in the test substrate given the (measured) values for dX and dY.

It should be noted that instead of using a Rx, Ry tilt for the exposure of the calibration marks, the calibration marks may also be exposed with a focus offset per field.

By measuring defocus using the method according to an embodiment of the invention, a focus versus alignment shift sensitivity of up to 50 times higher than a conventional LVT may be obtained, typically $d(X,Y)/dZ=20$. This sensitivity is well in line with future system needs as for signal to (alignment) noise ratio. Also, an embodiment of the presented method uses a standard binary mask which images standard FOCAL marks. Hence, this method will be fully compatible with future ways of illumination (as in maskless and EUV). Standard binary mask are generally easy to manufacture with relative low costs. An embodiment of the presented method has a higher spatial distribution of marks than the state of the art methods; 247 verification marks per field compared to 55 verification marks of LVT, which will result a higher resolution of the defocus maps.

It is noted that apart from providing leveling focus information, embodiments of methods according to the invention can be used for:

Chuck Deformation Map (CDM) calibration (with a higher spatial density)

2D Grid plate calibration (NXT) (requiring a high spatial density)

chuck-to-chuck focus plane offset ATP test

Image Plane Deviation (IPD) ATP test

Rx calibration (requiring a higher spatial density then supported by LVT)

Embodiments may also be suitable for investigating fluid lens temperature impact on focus. By exposing at different numerical aperture different temperature sensitivity can be obtained.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring the focus of a lithographic projection apparatus, said method comprising:
   covering a test substrate with photo resist;
   placing said test substrate on a substrate table of said lithographic apparatus;
   exposing a plurality of verification fields on said test substrate, each of said verification fields comprising a plurality of verification markers, wherein said verification fields are exposed using a predetermined focus offset in a predetermined focal curve;
   exposing a plurality of calibration fields on said test substrate, each of said calibration fields comprising a plurality of calibration markers, said calibration fields being exposed with predefined tilt offsets per calibration field;
   developing said photo resist;
   measuring an alignment offset for each of said verification markers;
   measuring an alignment offset for each of said plurality of calibration markers to render calibration data;
   determining a calibration curve using said calibration data;
   making a reference focal curve by using a portion of said calibration curve;
   translating the measured alignment offsets for each of said verification markers into defocus data using the reference focal curve.

2. A method according to claim 1, wherein said predetermined focus offset is selected so that a local value of said predetermined focal curve of said lithographic apparatus is less than a maximum value of said predetermined focal curve.

3. A method according to claim 2, wherein said predetermined focus offset FO is selected so that said predetermined focal curve of said lithographic apparatus is substantially linear in a working range around said focus offset.

4. A method according to 3, wherein said calibration fields are exposed with a shift in a plane with respect to said verification fields.

5. A method of calibrating a lithographic projection apparatus, said method comprising a method of measuring focus according to claim 1, wherein said defocus data is used to adjust settings of said lithographic projection apparatus.

6. A method of calibrating a lithographic projection apparatus, comprising:
   covering a test substrate with photo resist;
   placing the test substrate on a substrate table of the lithographic apparatus;
   exposing a plurality of verification fields on the test substrate, each of the verification fields comprising a plurality of verification markers, wherein the verification fields are exposed using a predetermined focus offset in a predetermined focal curve;
   exposing a plurality of calibration fields on the test substrate, each of the calibration fields comprising a plurality of calibration markers, the calibration fields being exposed with predefined tilt offsets per calibration field;
   developing the photo resist;
   measuring an alignment offset for each of the verification markers;
   measuring an alignment offset for each of the plurality of calibration markers to render calibration data;
   determining a calibration curve using the calibration data;
   making a reference focal curve by using a portion of the calibration curve;
   translating the measured alignment offsets for each of the verification markers into defocus data using the reference focal curve; and
   using the defocus data to adjust settings of the lithographic projection apparatus.

7. A method according to claim 6, wherein the predetermined focus offset FO is selected so that the local value of the predetermined focal curve of the lithographic apparatus is less than a maximum value of the predetermined focal curve.

8. A method according to claim 7, wherein the predetermined focus offset FO is selected so that the predetermined focal curve of the lithographic apparatus is substantially linear in a working range around the focus offset.

9. A method according to claim 6, wherein the calibration fields are exposed with a shift in the plane with respect to the verification fields.

* * * * *